United States Patent
Rachmady et al.

(10) Patent No.: US 9,590,089 B2
(45) Date of Patent: Mar. 7, 2017

(54) VARIABLE GATE WIDTH FOR GATE ALL-AROUND TRANSISTORS

(75) Inventors: Willy Rachmady, Beaverton, OR (US); Van H. Le, Portland, OR (US); Ravi Pillarisetty, Portland, OR (US); Jack T. Kavalieros, Portland, OR (US); Robert S. Chau, Beaverton, OR (US); Seung Hoon Sung, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 279 days.

(21) Appl. No.: 13/997,162

(22) PCT Filed: Dec. 30, 2011

(86) PCT No.: PCT/US2011/068239
§ 371 (c)(1),
(2), (4) Date: Jun. 21, 2013

(87) PCT Pub. No.: WO2013/101230
PCT Pub. Date: Jul. 4, 2013

(65) Prior Publication Data
US 2013/0341704 A1    Dec. 26, 2013

(51) Int. Cl.
*H01L 29/78*       (2006.01)
*H01L 29/423*      (2006.01)
(Continued)

(52) U.S. Cl.
CPC .............. *H01L 29/78* (2013.01); *B82Y 10/00* (2013.01); *H01L 29/0673* (2013.01);
(Continued)

(58) Field of Classification Search
CPC . H01L 29/0669; H01L 29/78; H01L 29/0673; H01L 29/1033; H01L 29/4243;
(Continued)

(56) References Cited

U.S. PATENT DOCUMENTS 7,495,942 B2 *   2/2009   Davis et al. ................. 365/49.1
7,893,492 B2 *   2/2011   Bedell et al. ................. 257/346
(Continued)

FOREIGN PATENT DOCUMENTS

CN   102034863 A   4/2011
CN   102301480 A   12/2011
(Continued)

OTHER PUBLICATIONS

Office Action (including Search Report) from Examiner of the Intellectual Property Office (the IPO) dated Dec. 31, 2015 for Taiwan Patent Application No. 104108657 and English Translation thereof.
(Continued)

*Primary Examiner* — Julio J Maldonado
*Assistant Examiner* — Farun Lu
(74) *Attorney, Agent, or Firm* — Blakely, Sokoloff, Taylor & Zafman LLP

(57) ABSTRACT

Nanowire-based gate all-around transistor devices having one or more active nanowires and one or more inactive nanowires are described herein. Methods to fabricate such devices are also described. One or more embodiments of the present invention are directed at approaches for varying the gate width of a transistor structure comprising a nanowire stack having a distinct number of nanowires. The approaches include rendering a certain number of nanowires inactive (i.e. so that current does not flow through the nanowire), by severing the channel region, burying the source and drain regions, or both. Overall, the gate width of nanowire-based structures having a plurality of nanowires may be varied by rendering a certain number of nanowires inactive, while maintaining other nanowires as active.

16 Claims, 15 Drawing Sheets

(51) Int. Cl.

| | | |
|---|---|---|
| *H01L 29/66* | (2006.01) | |
| *H01L 29/775* | (2006.01) | |
| *H01L 29/06* | (2006.01) | |
| *H01L 29/10* | (2006.01) | |
| *H01L 29/786* | (2006.01) | |
| *B82Y 10/00* | (2011.01) | |
| *B82Y 40/00* | (2011.01) | |

(52) U.S. Cl.
CPC ...... *H01L 29/1033* (2013.01); *H01L 29/4232* (2013.01); *H01L 29/66439* (2013.01); *H01L 29/66545* (2013.01); *H01L 29/66613* (2013.01); *H01L 29/775* (2013.01); *H01L 29/785* (2013.01); *H01L 29/78696* (2013.01); *B82Y 40/00* (2013.01); *Y10S 977/762* (2013.01); *Y10S 977/89* (2013.01); *Y10S 977/938* (2013.01)

(58) Field of Classification Search
CPC ......... H01L 29/66439; H01L 29/66545; H01L 29/66613; H01L 29/775; H01L 29/785; H01L 29/78696; B82Y 10/00; B82Y 40/00; Y10S 977/762; Y10S 977/08
USPC .......................................... 257/327; 438/197
See application file for complete search history.

(56) References Cited

U.S. PATENT DOCUMENTS

| | | | |
|---|---|---|---|
| 8,422,273 B2 | 4/2013 | Chang et al. | |
| 8,884,363 B2 | 11/2014 | Xiao et al. | |
| 2006/0024874 A1 | 2/2006 | Yun et al. | |
| 2006/0071275 A1* | 4/2006 | Brask | H01L 21/845 257/350 |
| 2007/0291524 A1 | 12/2007 | Davis et al. | |
| 2008/0128760 A1* | 6/2008 | Jun | B82Y 10/00 257/280 |
| 2010/0019389 A1 | 1/2010 | Cerofolini et al. | |
| 2010/0167504 A1 | 7/2010 | Anderson et al. | |
| 2010/0207208 A1* | 8/2010 | Bedell | B82Y 10/00 257/346 |
| 2010/0295021 A1 | 11/2010 | Chang et al. | |
| 2010/0295024 A1 | 11/2010 | Pernel et al. | |
| 2010/0297816 A1 | 11/2010 | Bedell et al. | |
| 2011/0062417 A1 | 3/2011 | Iwayama et al. | |

FOREIGN PATENT DOCUMENTS

| | | |
|---|---|---|
| JP | 2007-123867 A | 5/2007 |
| TW | 201115734 A | 5/2011 |
| WO | WO 2011/087605 A2 | 7/2011 |

OTHER PUBLICATIONS

S. Bangsaruntip, et al., "High Performance and High Uniform Gate-All-Around Silicon Nanowire MOSFETs with Wire Size Dependent Scaling", Electronic Devices Meeting (IEDM) 2009 IEEE International, IEEE, Dec. 9, 2009, pp. 1-4.

International Search Report mailed Sep. 20, 2012 for PCT/US2011/068239, filed Dec. 30, 2011, 3 pages.

First Office Action (including Search Report) from Chinese Patent Office dated Mar. 28, 2016 for Chinese Patent Application No. 201180075972.1.

Second Office Action from Chinese Patent Office dated Nov. 7, 2016 for Chinese Patent Application No. 201180075972.1 (6 pages).

Office Action including Search Report (4 pages) from Examiner of the Intellectual Property Office (the IPO) dated Jan. 10, 2017 for Taiwan Patent Application No. 105116643 and English Translation (2 pages) thereof.

\* cited by examiner

VARIABLE GATE WIDTH FOR GATE ALL-AROUND TRANSISTORS

CROSS-REFERENCE TO RELATED APPLICATION

This patent application is a U.S. National Phase Application under 35 U.S.C. §371 of International Application No. PCT/US2011/068239, filed Dec. 30, 2011, entitled VARIABLE GATE WIDTH FOR GATE ALL-AROUND TRANSISTORS.

FIELD OF THE INVENTION

Embodiments of this invention relate to the field of semiconductor devices and more particularly to non-planar gate all-around device structures and methods of fabricating such structures with varied gate widths.

BACKGROUND

As integrated device manufacturers continue to shrink the feature sizes of transistor devices to achieve greater circuit density and higher performance, there is a need to manage transistor drive currents while reducing short-channel effects such as parasitic capacitance and off-state leakage for next-generation devices.

Non-planar transistors, such as fin-based dual- and tri-gate transistors improve control of short channel effects. For example, with tri-gate transistors, the gate forms adjacent to three sides of the channel region. Because the gate structure surrounds the fin on three surfaces, the transistor essentially has three gates controlling the current through the channel region of the fin. These three gates allow for fuller depletion within the fin and result in less short-channel effects due to steeper sub-threshold current swing (SS) and smaller drain induced barrier lowering (DIBL). Recently, wrap-around gate structures have been developed wherein the gate electrode and source/drain contacts wrap around the full perimeter of semiconductor nanowires, enabling greater management of leakage and capacitance in the active regions, even as drive currents increase.

Drive currents are typically tailored to device specifications by varying the gate width. In dual- and tri-gate devices, the fin height can be altered. However, new wrap-around transistors require different strategies to vary gate width of nanowire-based devices, and also require further development of new fabrication methods that can be integrated into current processes.

DETAILED DESCRIPTION

Figure 1A:
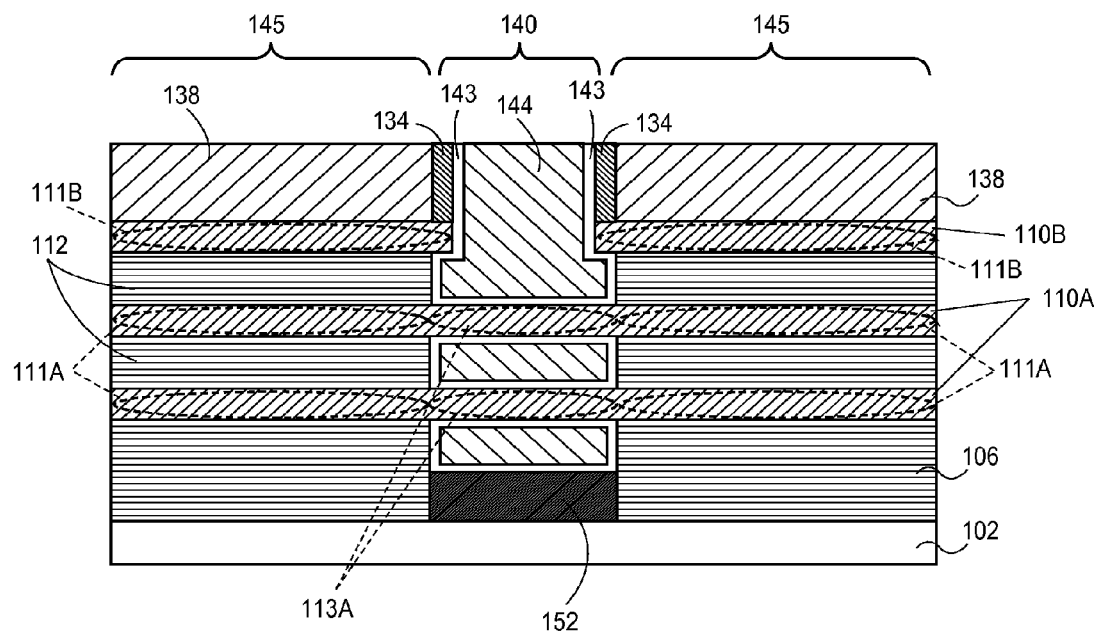
FIG. 1A illustrates a two-dimensional cross-sectional view of a nanowire-based semiconductor structure, in accordance of an embodiment of the invention.

Gate all-around transistors with variable gate width and methods for forming such transistors are described. Embodiments of the present invention have been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Nanowire-based gate all-around transistor devices having one or more active nanowires and one or more inactive nanowires are described herein. Methods to fabricate such transistors are also described. One or more embodiments of the present invention are directed at approaches for varying the gate width of a transistor structure comprising a vertical nanowire stack having a distinct number of nanowires. The approaches include rendering a certain number of nanowires inactive (i.e. so that current does not flow through the channel portion of the nanowire), by severing the channel portion of the nanowire, by burying the source and drain portion of the nanowire, or both. Overall, the gate width of nanowire-based structures having a plurality of nanowires may be varied by inactivating a certain number of nanowires, while other nanowires remain active.

In one embodiment, a nanowire in a vertical nanowire stack is made inactive by etching the channel portion of the nanowire. The vertical nanowire stack has alternating layers of nanowire material and sacrificial material. A sacrificial gate structure wraps around the vertical nanowire stack, defining a channel region of the transistor and a source and drain region on opposite sides of the channel region. The sacrificial gate structure is removed to expose the vertical nanowire stack, and the sacrificial material is removed to expose the perimeter of the channel portion of each nanowire within the channel region. Dielectric material is then formed within the channel region, such that the channel portions of the lower nanowires are covered, while the channel portion of the upper nanowire is exposed at the top of the channel region. The exposed channel portion of the upper nanowire is then severed by etching, forming an inactive nanowire. The dielectric material is removed to expose each unetched channel portion of the lower nanowires. A functional gate structure is formed in the channel region, wrapping around the unetched channel portions of the lower, active nanowires.

In another embodiment, a nanowire in a vertical nanowire stack is made inactive by isolating the channel portion of the inactive. In an embodiment, a contact opening is etched to expose the vertical nanowire stack in the source/drain regions of the transistor. The sacrificial material is then removed from between the source/drain portions of the nanowires. A dielectric material is formed within the contact opening, such that the source/drain portions of the lower nanowire, i.e. the nanowire closest to the substrate, are buried. Source/drain contacts are then formed within the contact opening, wrapping around the exposed source/drain portions of each upper nanowire. Contact is not made to the source/drain portions of the buried lower nanowire. As such, the channel portion is electrically isolated from the source/drain regions, and the nanowire is inactive.

The perimeter of each active nanowire in a transistor forms the conductive portion of the channel. As such, the total gate width of the transistor is the sum of the perimeters of the active nanowires. Inactive nanowires do not contribute to the total gate width. Thus, for a nanowire stack having a given number of nanowires, the total gate width may be varied by changing the number of active and inactive nanowires within the nanowire stack.

Figure 1B:
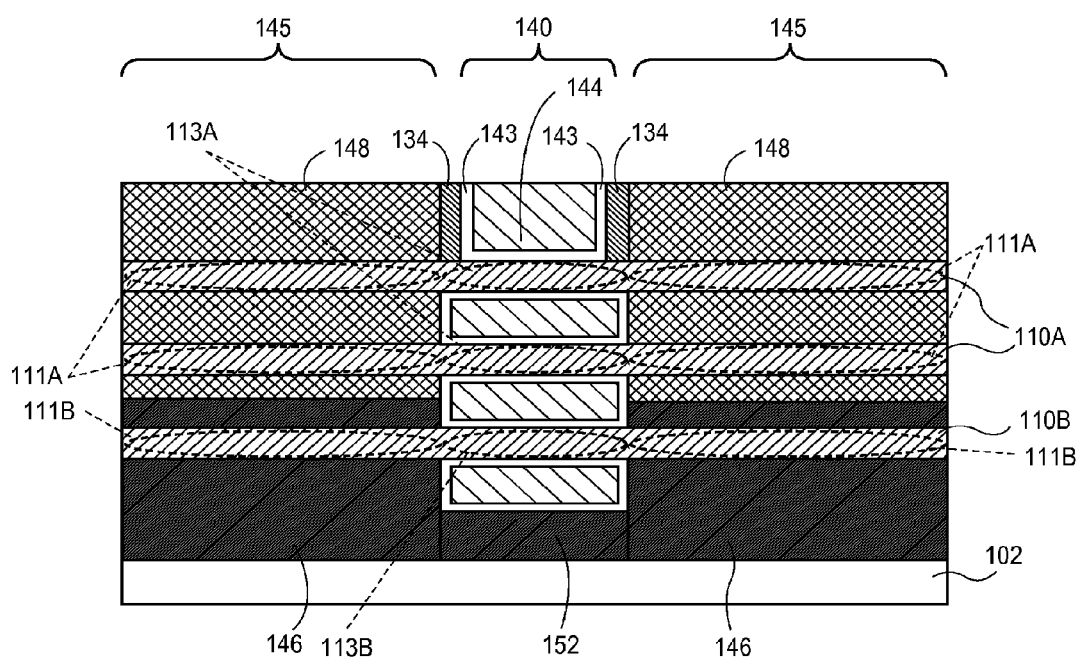
FIG. 1B illustrates a two-dimensional cross-sectional view of a nanowire-based semiconductor structure, in accordance with an embodiment of the invention.

FIGS. 1A and 1B illustrate embodiments of a nanowire-based semiconductor device, in accordance with an embodiment of the present invention. FIG. 1A is a two dimensional cross-sectional view of a transistor having two active nanowires contributing to the gate width and one inactive nanowire with a discontinuous channel portion. FIG. 1B is a two dimensional cross-sectional view of a transistor device having two active nanowires contributing to the transistor gate width and one inactive nanowire with buried source and drain portions. While three nanowires are shown in FIGS. 1A-1B by way of illustration, it is to be understood that other embodiments may comprise more or fewer nanowires.

In FIG. 1A, a plurality of vertically stacked nanowires 110 are disposed above a substrate 102, according to an embodiment of the invention. A gate structure wraps around each active nanowire 110A, defining a channel region 140 of the device and channel portions 113A disposed in each active nanowire 110A. Source and drain regions 145 are located on opposite sides of each channel region 140. The gate structure comprises gate dielectric layer 143 and gate electrode 144. By wrapping completely around the channel portion 113A of each active nanowire 110A, the gate structure increases gate control over that of planar and fin-based transistors by completely cutting off parasitic leakage paths, thereby improving short channel effects. In an embodiment of the invention, inactive nanowire 110B has a discontinuous channel portion, so that current cannot flow between the source and drain portions 111B. In an embodiment, the source and drain portions 111 of each nanowire 110 are separated by sacrificial material 112. The source and drain portions 111A of the bottom-most nanowire 110A rest on base fin 106. Bottom gate isolation 152 isolates the gate structure from the substrate 102.

Substrate 102 may be composed of a material suitable for semiconductor device fabrication. In one embodiment, the structure is formed using a bulk semiconductor substrate. Substrate 102 may include, but is not limited to, silicon, germanium, silicon-germanium, or a III-V compound semiconductor material. In another embodiment, the structure is formed using a silicon-on-insulator (SOI) substrate. An SOI substrate includes a lower bulk substrate, a middle insulator layer disposed on the lower bulk substrate, and a top monocrystalline layer. The middle insulator layer may comprise silicon dioxide, silicon nitride, or silicon oxynitride. The top single crystalline layer may be any suitable semiconductor material, such as those listed above for a bulk substrate.

In an embodiment, nano wires 110 and sacrificial material 112 are each a semiconductor material. In one such embodiment, nanowires 110 and sacrificial material 112 are single-crystalline and have a lattice constant. In an embodiment, sacrificial material 112 may be any material that can be selectively etched with respect to nanowires 110. In an embodiment, sacrificial material 112 is a material that can create stress in nanowires 110. Nanowires 110 and sacrificial material 112 may each be a material such as, but not limited to, silicon, germanium, SiGe, GaAs, InSb, GaP, GaSb, InAlAs, InGaAs, GaSbP, GaAsSb, and InP. In a specific embodiment, nanowires 110 are silicon and sacrificial material 112 is SiGe. In another specific embodiment, nanowires 110 are germanium, and sacrificial material 112 is SiGe. In an embodiment, the nanowires 110 comprise a stressed material, particularly in the channel portions 113.

In an embodiment, each nanowire 110 may be sized as wires or ribbons, as described below, and may have squared-off or rounded corners. The thicknesses of each nanowire 110 determines the electrical characteristics, integration and performance of the transistor device. In an embodiment, each nanowire 110 is sufficiently thick to avoid excessive surface scattering, which can cause high channel resistance. Each nanowire 110 is also sufficiently thin to allow the transistor to operate in a fully depleted manner. In an embodiment, the dimensions of a nanowire 110, from a cross-sectional perspective, are on the nano-scale. For example, in a specific embodiment, the smallest dimension of a nanowire 110 is less than approximately 20 nm.

The gate width of a transistor determines the drive current capacity of the transistor. For nanowire-based transistors, the cumulative length of the perimeters of the channel regions of the active nanowires determine the gate width for that transistor. Because the cross-sectional area of nanowires is restricted by both depletion and surface scattering concerns, gate width may be increased or decreased by increasing or decreasing the number of active nanowires of a given size in a transistor. Larger numbers of active nanowires 110A allow for greater drive current capacity of the transistor device by increasing the gate width. However, the number of active nanowires is limited by restrictions on the total height of the nanowire stack, comprising both active and inactive nanowires. As the height of a nanowire stack increases, the risk of non-integration increases. Nanowire transistors may have from one to 10 nanowires. In an embodiment, the nanowire stack comprises three nanowires, as shown in FIG. 1A.

In an embodiment, gate dielectric layer 143 is composed of a high k dielectric material. For example, in one embodiment, the gate dielectric layer 143 is composed of a material such as, but not limited to, hafnium oxide, hafnium oxy-nitiride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

In an embodiment, gate electrode 144 is composed of a metal layer such as, but not limited to, metal nitrides, metal carbides, metal silicides, metal aluminides, halfnium, zirconium, titanium, tantalum, aluminum, ruthenium, palladium, cobalt, nickel or conductive metal oxides. In a specific embodiment, the gate electrode is composed of a non-workfunction-setting fill material formed above a metal workfunction-setting layer. In an embodiment, gate electrode 144 comprises a p-type work function metal. In another embodiment, gate electrode 144 comprises an n-type work function metal.

In one aspect, Source and drain portions 111 of nanowires 110 and sacrificial material 112 between source and drain portions 111 form heterogenous source and drain regions 145, as shown in FIG. 1A. In an embodiment, heterogeneous source and drain regions 145 may be doped or undoped.

In another aspect, sacrificial material 112 is removed from between source and drain portions 111, so that source and drain regions 145 comprise the source and drain portions 111 of nanowires 110. A metal contact may then be formed, wrapping around the source and drain portions of 111A to establish contact to active nanowires 110A.

In another aspect, homogeneous source and drain regions 145 are formed. In an embodiment, both the source and drain portions 111 of nanowires 110 and sacrificial material 112 are removed from the source and drain regions 145. In a specific embodiment, a semiconductor material is grown from the substrate, forming contact to the channel portions 113 of each nanowire 110. In an embodiment, homogeneous source and drain regions 145 may be doped or undoped. In another specific embodiment, a metal species is formed within source and drain regions 145, forming contact to the channel portions 113 of the nanowires 110.

Sidewall spacers 134 may be formed on the vertical sidewalls of the gate structure in order to offset optional doping of the source and drain regions and/or to insulate the gate electrode from any epitaxial material subsequently grown on the source and drain regions. Sidewall spacers 134 may be composed of an insulative dielectric material such as, but not limited to, silicon dioxide, silicon oxy-nitride, or silicon nitride.

FIG. 1B illustrates another embodiment of the invention, wherein the channel portion of an inactive nanowire is electrically isolated from the source and drain regions of the transistor. A plurality of vertically stacked nanowires 110 are disposed above a substrate 102, according to an embodiment of the invention. The gate structure, comprising gate electrode 144 and gate dielectric 143, define the channel region 140 of the device and a source and drain region 145 on opposite sides of the channel region. Active nanowires 110A have a channel portion 113A and source and drain portions 111A. Inactive nanowire 110B has a channel portion 113B and inactive source and drain portions 111B.

In an embodiment, the source and drain portions 111A of each active nanowire 110A are completely surrounded by source and drain contacts 148. In an embodiment, inactive nanowire 110B is not electrically coupled to the source and drain regions 145. In an embodiment, the source and drain portions 111B of each inactive nanowire 110B are buried by dielectric material 146, electrically isolating channel portion 113B via source and drain portion 11B. In an embodiment, all nanowires 110 each have an intact channel portion 113, as shown in FIG. 1B.

The source and drain contacts 148 are, in an embodiment, fabricated from a metal species. The metal species may be a pure metal, such as nickel, cobalt, or palladium, or may be an alloy such as a metal-metal alloy or a metal-semiconductor alloy (e.g., such as a silicide material). In an embodiment, a titanium nitride primer layer is formed within the trench prior to formation of the contact metal.

In another aspect of the invention, methods of fabricating a nanowire-based semiconductor device are provided. FIGS. 2A-2K illustrate three-dimensional perspectives and two dimensional cross-sectional views representing various operations in a method of fabricating a nanowire-based transistor, in accordance with an embodiment of the present invention.

Figure 2A:
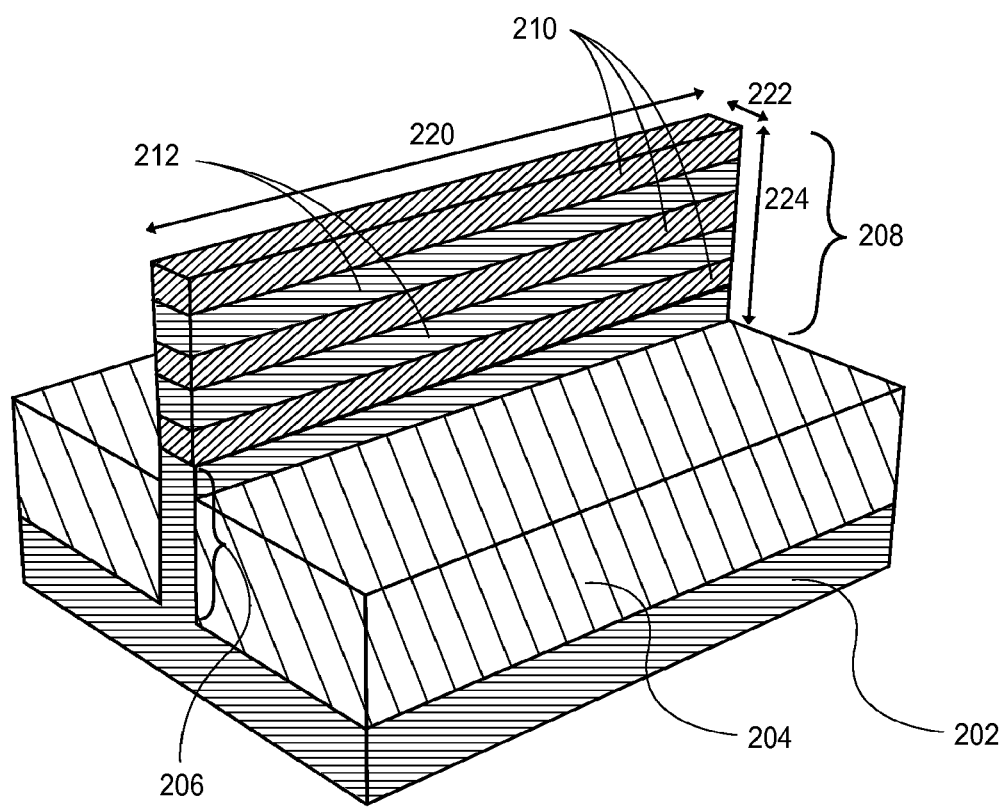
FIGS. 2A-2D illustrate a three-dimensional perspective of operations in a process for forming a nanowire-based transistor, in accordance with an embodiment of the invention.

A method of fabricating a semiconductor device may include forming a plurality of nanowires above a substrate. FIG. 2A illustrates a specific example showing the formation of three nanowires. A substrate 202 having a vertical nanowire stack 208 disposed thereon is provided. In an embodiment, vertical nanowire stack 208 comprises alternating layers of nanowire 210 material and sacrificial material 212. In an embodiment, nanowire stack comprises three nanowires 210 and two layers of sacrificial material 212.

In an embodiment, nanowires 210 and sacrificial material 212 may be formed by growing alternating layers of material over the surface of a bulk semiconductor substrate, and then patterning the layers to form a fin-type structure, e.g. with a mask and plasma etch process. In an embodiment, the alternating layers are formed over a single-crystalline silicon substrate. In another embodiment, the alternating layers are formed over a bulk silicon substrate having a top SiGe layer. In an embodiment, the fin-type structure comprises vertical nanowire stack 208 disposed on base fin 206. In an embodiment, base fin 206 is formed from the top portion of substrate 202, where the substrate material acts as sacrificial material below the bottom-most nanowire. In another embodiment, base fin 206 is formed from the same material as sacrificial material 212. In another embodiment, base fin 206 is formed from a combination of both substrate 202 and sacrificial material 212. Sacrificial material 212 may be grown from or deposited on the surface of substrate 202 in order to form part of bulk fin 206. Bulk fin 206 may also comprise buffer layers that serve to grade the lattice constant from the substrate to the surface from which vertical nanowire stack 208 is grown.

In an embodiment, substrate 202 may also include shallow trench isolation (STI) regions 204. STI regions 204 serve to reduce current leakage between adjacent devices. STI regions 204 may be formed by conventional semiconductor patterning methods (e.g., photolithography and etching). STI regions 204 may comprise a dielectric material such as, for example, silicon oxide, silicon nitride, silicon oxynitride, and combinations thereof.

In another embodiment, vertical nanowire stack 208 is formed on an SOI substrate, which comprises a bottom substrate, a middle insulation layer, and a top single-crystalline semiconductor layer. In an embodiment, the layers comprising vertical nanowire stack 208 are grown from the top single-crystalline semiconductor layer, and then patterned into a fin-type structure. In an embodiment, the middle insulation layer serves as the isolation layer.

In an embodiment, nanowires 210 and sacrificial material 212 are each formed from a single-crystalline material having a lattice constant. In an embodiment, nanowires 210 and sacrificial material 212 are formed from a semiconductor material. In an embodiment, sacrificial material 212 is formed from a material that may be selectively etched with respect to nanowires 210. In an embodiment, sacrificial material 212 is selected to generate stress in nanowires 210. Ideally, nanowires 210 and sacrificial material 212 in vertical nanowire stack 208 are each formed from a single crystalline semiconductor material such as, but not limited to Si, Ge, SiGe, GaAs, InSb, GaP, GaSb, InAlAs, InGaAs, GaSbP, GaAsSb and InP. In an embodiment, nanowires 210 are silicon and sacrificial material 212 is SiGe, to form an n-type transistor. In an embodiment, the nanowires 210 are undoped germanium and sacrificial material 212 is SiGe, to form a p-type transistor.

Vertical nanowire stack 208 has a height 224, a width 222, and a length 220. Vertical nanowire stack 208 is formed having a width 222 less than 30 nm and ideally less than 25 nm. In an embodiment, height 224 is less than the height where integration issues, such as fin toppling, fin profile distortion, and poor uniformity in fin critical dimensions, begin to occur. The thicknesses of nanowires 210 and sacrificial material 212 also affect height 224. In an embodiment, nanowires 210 and sacrificial material 212 are sufficiently thin to achieve a height 224 that is less than the height when integration issues begin to occur.

Figure 2B:
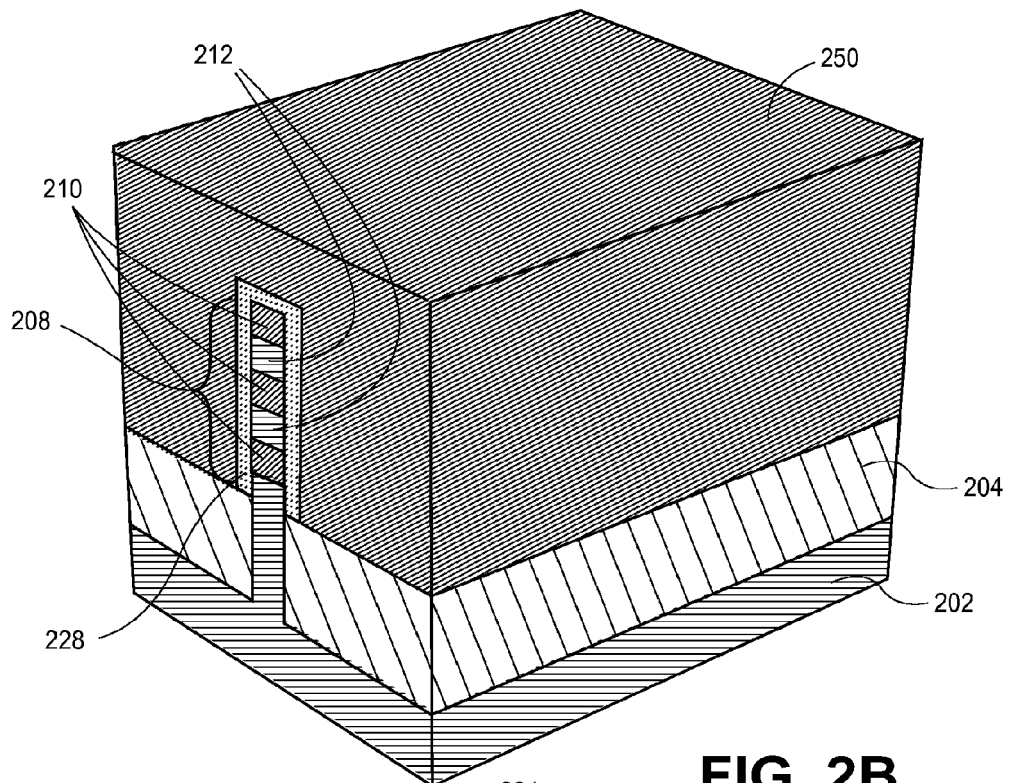

Next, a sacrificial gate dielectric layer 228 is blanket deposited over the top and sidewalls of vertical nanowire stack 208. Sacrificial gate dielectric layer 228 may be deposited to a thickness from about 10-50 Å. In a particular embodiment, sacrificial gate dielectric layer 228 is a dielectric material such as, for example, silicon oxide, silicon nitride, and silicon oxynitride. Sacrificial gate dielectric layer 228 may be deposited by conventional chemical vapor deposition (CVD) methods. As shown in FIG. 2B, a sacrificial gate material 250 is then blanket deposited over the structure, including sacrificial gate dielectric layer 228. Sacrificial gate material 250 is deposited to a thickness that exceeds the height of vertical nanowire stack 208. In an embodiment, sacrificial gate material 250 is formed from a semiconductor material such as, for example, polycrystalline silicon.

Figure 2C:
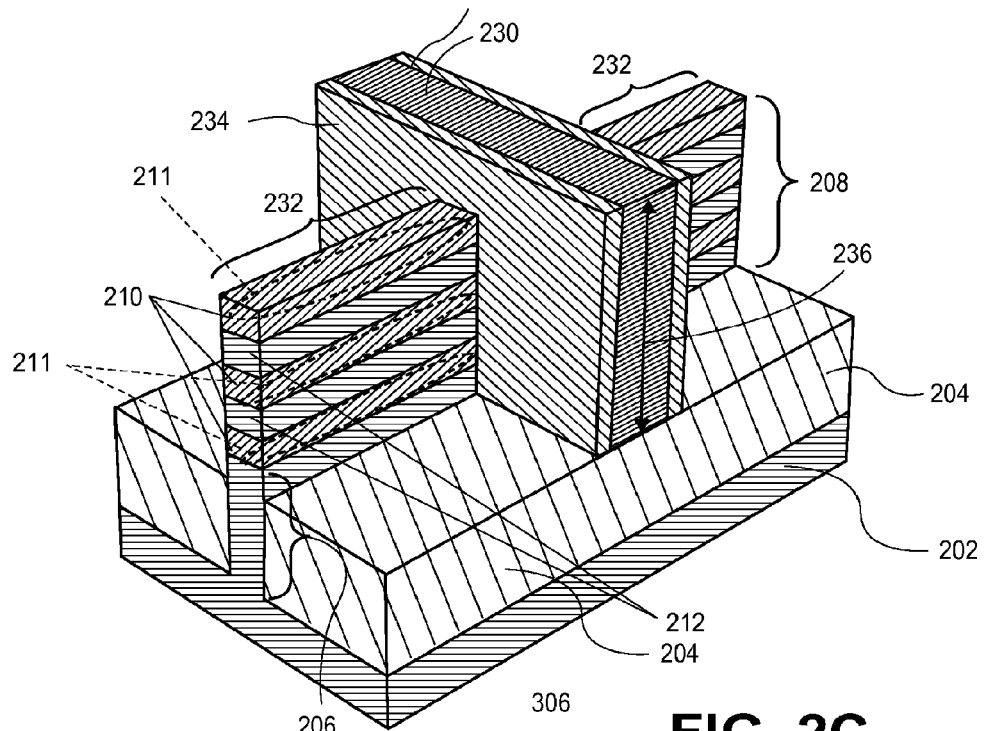

Next, a sacrificial gate electrode 230 is formed by patterning sacrificial gate material 250 using conventional photolithography and etching methods, according to an embodiment of the invention shown in FIG. 2C. Etching of sacrificial gate material 250 to form sacrificial gate electrode 230 exposes the sacrificial gate dielectric layer 228 on the source and drain regions of vertical nanowire stack 208. Sacrificial gate dielectric layer 228 serves as an etch stop layer during the patterning and formation of sacrificial gate 230, thereby preventing damage to the source and drain regions of vertical nanowire stack 208. In an embodiment, sacrificial gate dielectric layer 228 and sacrificial gate electrode 230 are formed from materials have sufficiently different etch selectivity such that sacrificial gate dielectric layer 228 may serve as an etch stop layer during the etching of sacrificial gate electrode 230.

Next, sacrificial gate dielectric layer 228 is removed from the top and sidewalls of vertical nanowire stack 208 using, for example, a conventional wet etch process. In an embodiment, sacrificial gate dielectric layer 228 is a silicon oxide layer removed using a dilute HF wet etch. Following the formation of the sacrificial gate structure, nanowires 210 may be doped, for example, by tip implantation or halo implantation, as is well-known in the art.

According to an embodiment of the invention shown in FIG. 2C, a pair of sidewall spacers 234 are formed on the sidewalls of sacrificial gate electrode 230 to offset optional doping of the source and drain regions and/or to insulate the gate electrode from any epitaxial material subsequently grown on the source and drain regions. The pair of sidewall spacers 234 may be formed using conventional methods of forming selective spacers known in the art. Sidewall spacers 234 may be any suitable dielectric material such as, but not limited to, silicon oxide, silicon nitride, silicon oxynitride and combinations thereof. In an embodiment, sidewall spacers 234 are from 20 to 100 Å thick.

In an embodiment, source and drain regions 245 are heterogeneous, comprising the source and drain portions 211 and sacrificial material 212 of the vertical nanowire stack as shown in FIG. 2C. In an embodiment, epitaxial material is grown on the surface of the vertical nanowire stack 208 within source and drain regions 245. Heterogeneous source and drain regions 245 may be doped or undoped. In an embodiment, the heterogeneous source and drain region 245 may be doped by ion implantation.

In another embodiment, source and drain regions 245 comprise the source and drain portions 211 of nanowires 210. In an embodiment, sacrificial material 212 and at least a portion of base fin 206 are removed from within source and drain regions 245 to expose the perimeter of source and drain portions 211 of nanowires 210. In an embodiment, source and drain portions 211 are coupled together by metal contacts. In an embodiment, the contacts wrap-around the exposed source and drain portions 211 of nanowires 210. In an embodiment, the contacts comprise a conductive metal species.

In another embodiment, source and drain regions 245 are homogeneous. To form homogenous source and drain regions, the source and drain portions 211, sacrificial material 212, and at least a portion of base fin 206 are removed. Then, a material is deposited within the source and drain regions to form contact with the channel portions 213 of each nanowire 210. In an embodiment, single-crystalline semiconductor material is grown from the substrate to form raised source and drain regions. In an embodiment, the homogeneous source and drain regions 245 provide stress to the channel portions 213 of nanowires 210. The semiconductor material may be in-situ doped if desired. In another embodiment, homogeneous source and drain regions 245 are formed by depositing a metal species to form contact with the channel portions 213 of nanowires 210.

Figure 2D:
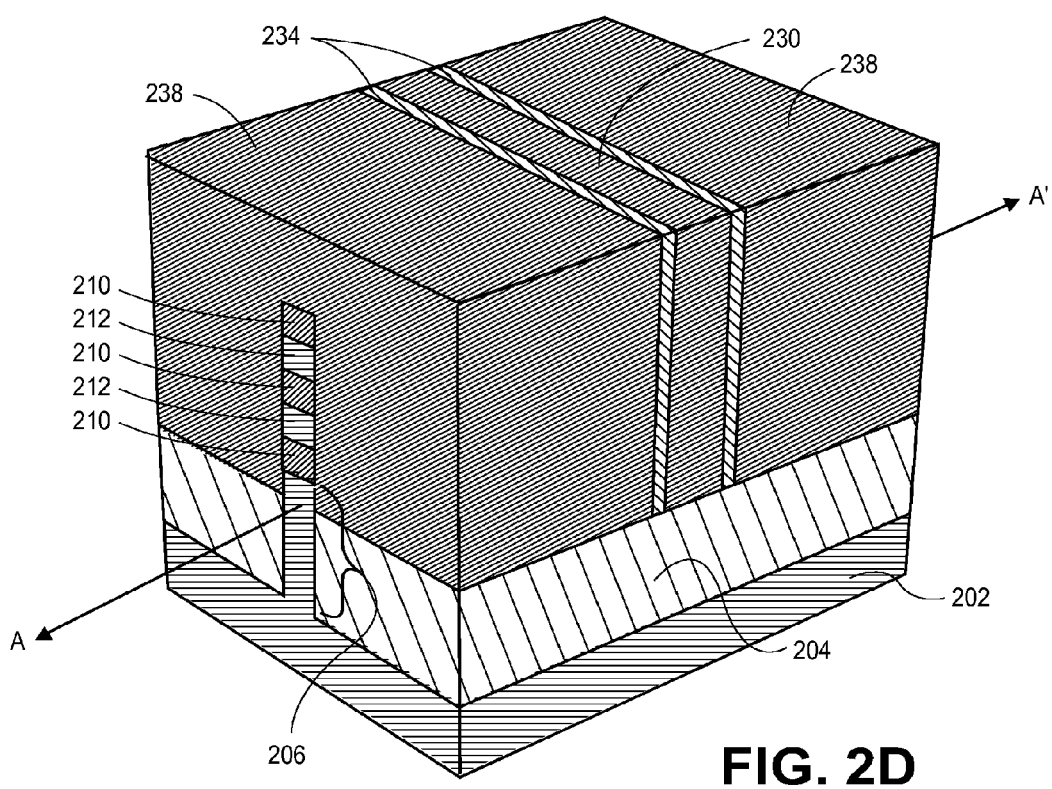

An inter-layer dielectric (ILD) layer 238 is blanket deposited over the substrate, according to an embodiment of the invention, as shown in FIG. 2D. The blanket ILD layer 238 may be deposited using a CVD. In an embodiment, ILD layer 238 is formed from any well-known dielectric material such as, but not limited to undoped silicon oxide, doped silicon oxide (e.g., BPSG, PSG), silicon nitride, and silicon oxynitride. ILD layer 238 is then polished back using a conventional chemical mechanical planarization method to expose the top of the sacrificial gate electrode 230 and the top of sidewall spacers 234.

Figure 2E:
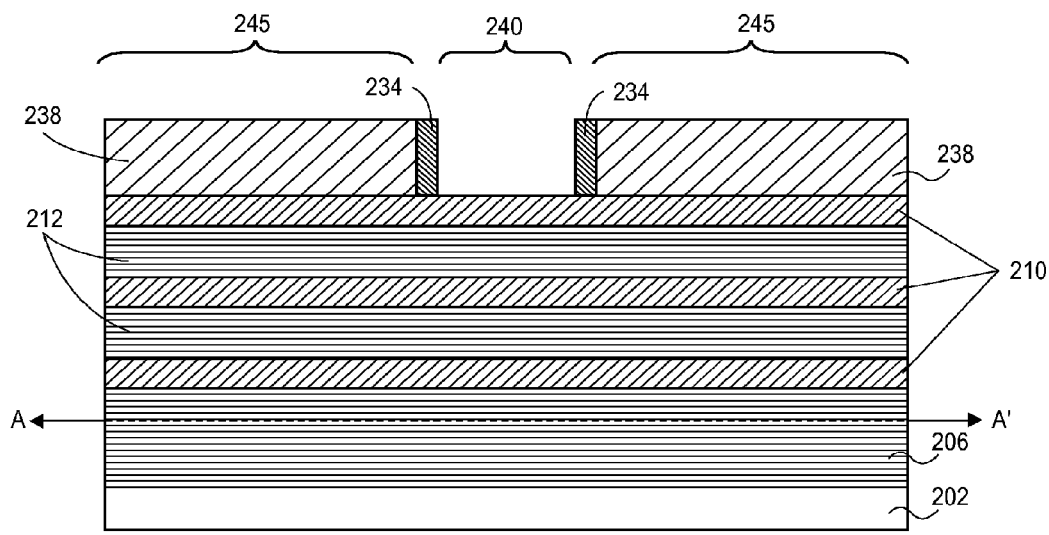
FIGS. 2E-2K illustrate a two-dimensional cross-sectional view of operations in a process for forming a nanowire-based transistor, in accordance with an embodiment of the invention.

Next, sacrificial gate electrode 230 is removed to expose sacrificial gate dielectric 228 on vertical nanowire stack 208 within the channel region 240, as shown in the embodiment illustrated by FIG. 2E. FIG. 2E is the two dimensional, cross sectional view of the embodiment shown in FIG. 2D, taken along line A-A'. ILD layer 238 protects vertical nanowire stack 208 within the source and drain regions 245 during the removal of the sacrificial gate electrode 230. In addition, the sacrificial gate dielectric layer 228 on vertical nanowire stack 208 within the channel region 240 serves as an etch stop, protecting vertical nanowire stack 208 during the removal of sacrificial gate electrode 230. Sacrificial gate electrode 230 may be removed using a conventional etching method such a plasma dry etch or a wet etch. In an embodiment, a wet etchant such as a TMAH solution may be used to selectively remove the sacrificial gate electrode.

In an embodiment, sacrificial gate dielectric layer 228 is then removed to expose vertical nanowire stack 208 within channel region 240. Sacrificial gate dielectric layer 228 may be removed using a conventional etching method. In an embodiment, sacrificial gate dielectric layer 228 is silicon oxide, which is removed by a dilute HF wet etch.

Figure 2F:
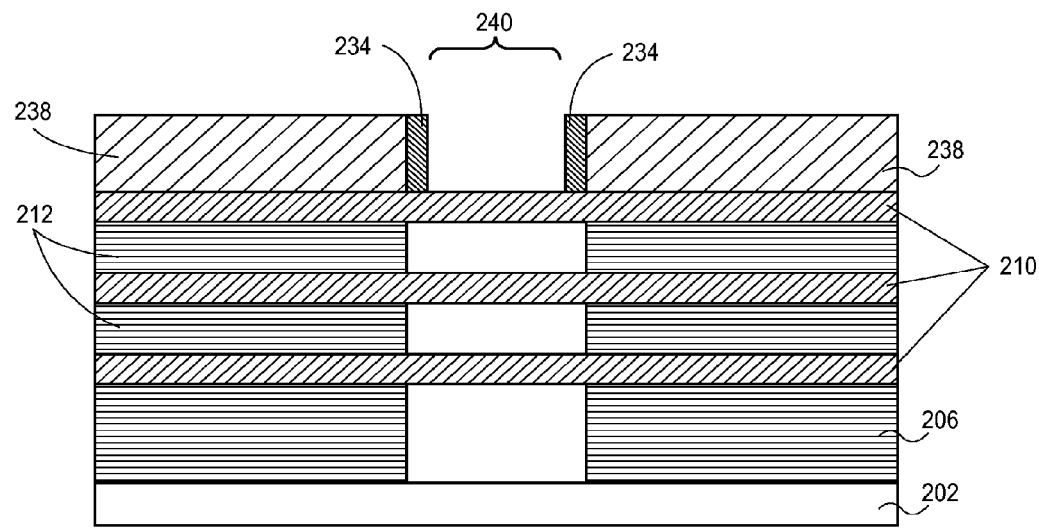

Next, sacrificial material 212 is removed from between nanowires 210 within channel region 240, as illustrated by FIG. 2F. In an embodiment, sacrificial material 212 is completely etched from between nanowires 210. In an embodiment, the etching process exposes all surfaces of nanowires 210 within the channel region 240. The removal of sacrificial material 212 leaves a void between adjacent nanowires 210, as shown in FIG. 2F. Sacrificial material 212 may be removed using any known etchant that is selective to nanowires 210. The selectivity of the etchant is greater than 50:1 for sacrificial material over nanowire material. In an embodiment, the selectivity is greater than 100:1. In an embodiment where nanowires 210 are silicon and sacrificial material 212 is silicon germanium, sacrificial material 212 is selectively removed using a wet etchant such as, but not limited to, aqueous carboxylic acid/nitric acid/HF solution and aqueous citric acid/nitric acid/HF solution. In an embodiment where nanowires 210 are germanium and sacrificial material 212 is silicon germanium, sacrificial material 212 is selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 2G:
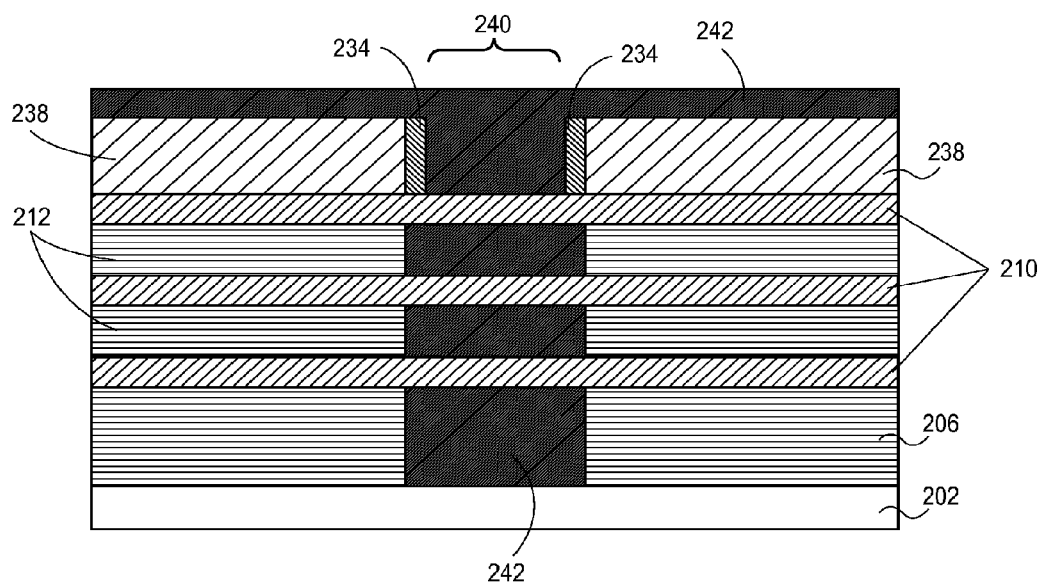
Figure 2H:
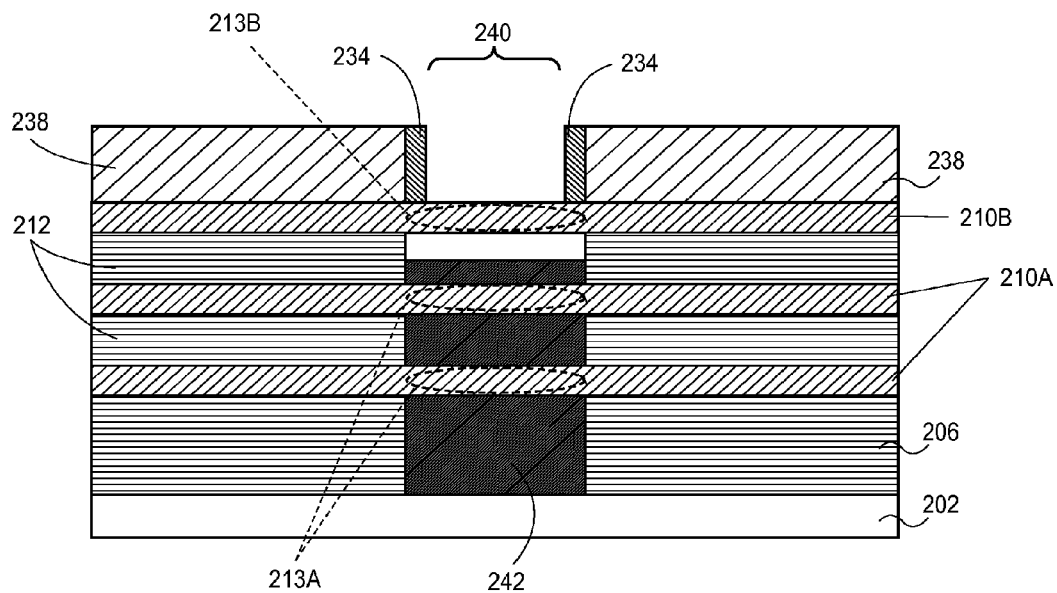

Dielectric material 242 is then blanket deposited over the substrate, surrounding nanowires 210 and completely filling the channel region 240, as illustrated by the embodiment shown in FIG. 2G. The dielectric material 242 completely fills the voids between nanowires 210, and also the space between the bottom-most nanowire and the top surface of substrate 202. Dielectric material 242 also forms on the top surface of ILD layer 238. In an embodiment, dielectric material 242 is formed from any well-known dielectric material such as, but not limited to silicon oxide, silicon nitride, and silicon oxynitride. In a specific embodiment, dielectric material 242 is formed from silicon dioxide. Ideally, dielectric material 242 is formed using a highly conformal deposition method such as low pressure chemical vapor deposition (LPCVD), atomic layer deposition (ALD), a spin-on-dielectric process, or a combination of these processes to ensure that the voids between nanowires 210 are completely filled.

Next, dielectric material 242 is removed from the surface of ILD layer 238 and then partially recessed within channel region 240, according to an embodiment of the invention. Dielectric material 242 is recessed to a depth within channel region 240 that is sufficient to completely expose the channel portion 213 of each nanowire 210. The number of channel portions 213 that are exposed is determined by the number of nanowires 210 that must be inactivated in order to achieve the desired transistor gate width. In the embodiment illustrate by FIG. 2H, the full perimeter of the channel portion 213B of upper nanowire 210B is exposed, while the channel portions 213A of each lower nanowire 210A remain completely buried by dielectric material 242. In an embodiment, dielectric material 242 is etched using a timed HF wet etch.

Figure 2I:
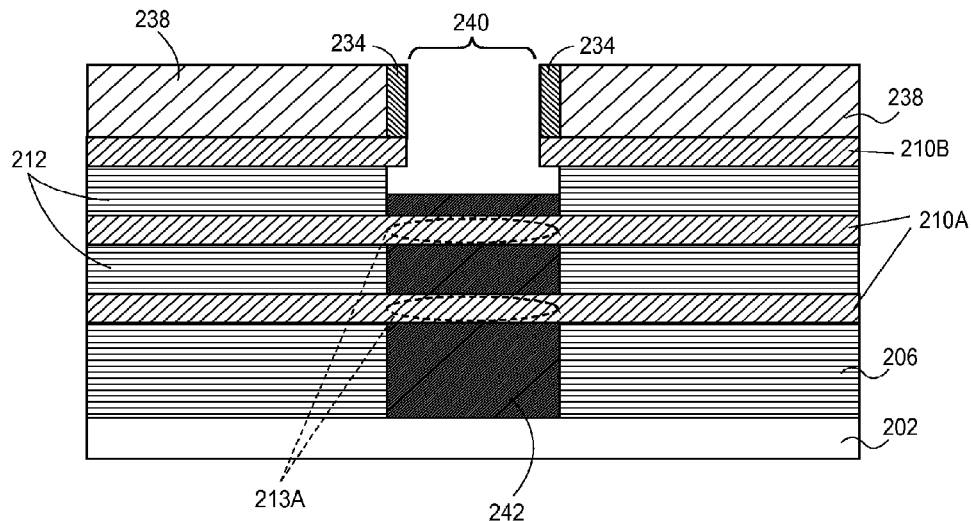

The exposed channel portion 213B of upper nanowire 210B is then severed, according to an embodiment of the invention. In an embodiment, the exposed channel portion 213B of upper nanowire 210B is etched to an extent that upper nanowire 210B cannot conduct current between the source and drain regions 245. In an embodiment, the channel portion 213B is fully removed, as shown in FIG. 2I. Channel portion 213B may be etched by any etch process selective to the dielectric material 242. Channel portion 213B may be etched by a wet or dry etch process. The dielectric material 242 protects channel portions 213A of each lower nanowire 210A, so that they are not etched.

Figure 2J:
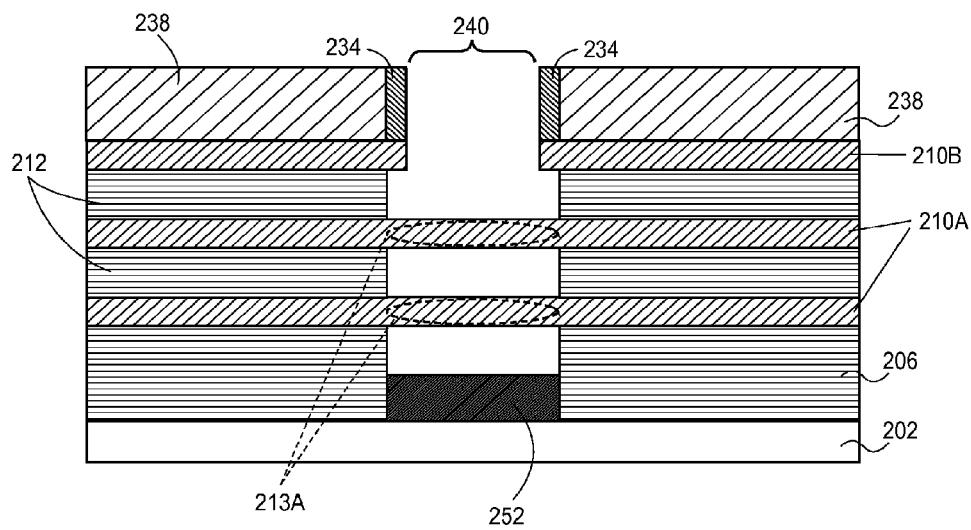

Dielectric material 242 is then further recessed to expose the protected channel portions 213A of each lower nanowire 210A, as shown in the embodiment illustrated by FIG. 2J. Dielectric material 242 remains on substrate 202 to form the bottom gate isolation 252. The thickness of the bottom gate isolation 252 depends on the length of time that dielectric material 242 is etched. In an embodiment, the wet etch recess is performed for a sufficiently long time to achieve a bottom gate isolation thickness that is thick enough to isolate the top surface of substrate 202 from capacitive coupling with the subsequently formed gate electrode. In an embodiment, the wet etch recess is performed for a sufficiently long time to achieve a bottom gate isolation thickness that is thin enough to allow the subsequently formed gate dielectric layer and gate electrode to be formed all-around the channel portion 213A of each lower nanowire 210A.

Next, a gate dielectric layer 243 is formed around the channel portion 213A of each lower nanowire 210A, according to an embodiment of the invention. Gate dielectric layer 243 may be formed from any well-known gate dielectric material as previously described. The gate dielectric layer 243 is formed using a highly conformal deposition process, such as atomic layer deposition (ALD), in order to ensure the formation of a gate dielectric layer having a uniform thickness around the channel portion 213A of each lower nanowire 210A. Gate dielectric layer 243 may be any suitable material, such as a high k dielectric. In a particular embodiment, the gate dielectric layer 243 is hafnium oxide deposited to a thickness between 10-60 A.

Figure 2K:
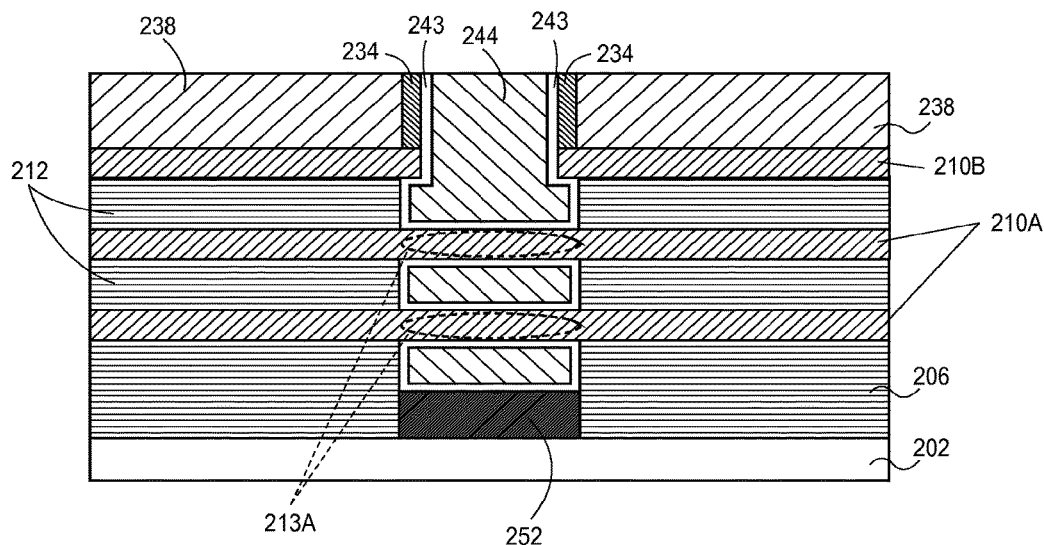

Next, a gate electrode material is blanket deposited over the gate dielectric layer 243 to form gate electrode 244. Gate electrode 244 may be formed from any well-known gate electrode material as previously described. The gate electrode material may be deposited using a conformal deposition process such as ALD to ensure that gate electrode 244 is formed on the gate dielectric layer 243 around and between the channel portions 213A of lower nanowires 210A. The gate electrode material and gate dielectric layer 243 on the top of ILD layer 238 are then chemically mechanically planarized until the top surface of the ILD layer 238 is revealed as shown in FIG. 2K, forming a transistor device. The cumulative length of the perimeters of each channel portion 213A determine the gate width for the transistor, according to an embodiment of the invention.

Figure 3A:
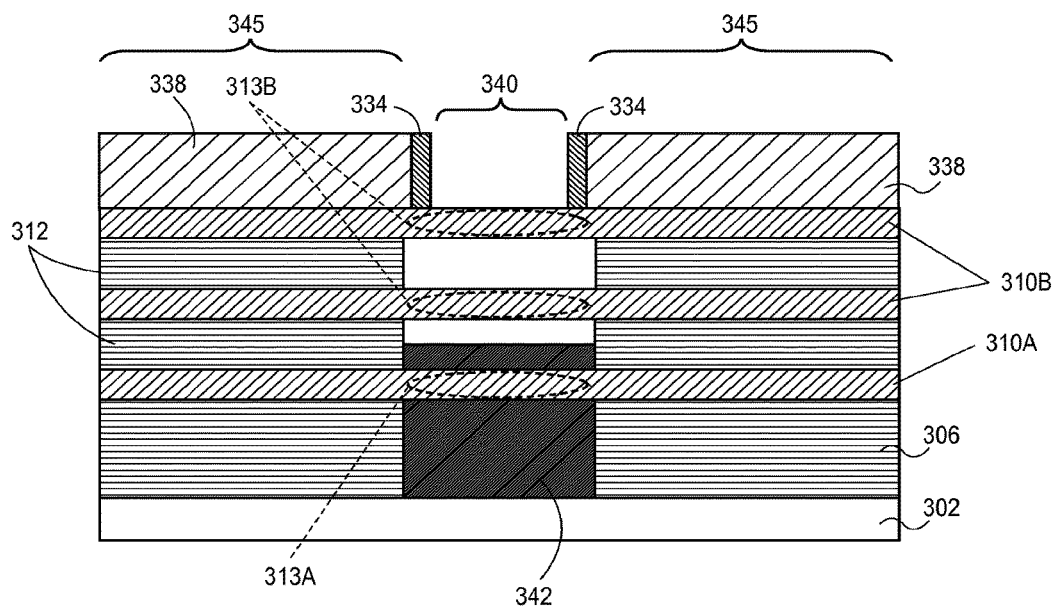
FIGS. 3A-3C illustrate a two-dimensional cross-sectional view of operations in a process for forming a nanowire-based transistor, in accordance with an embodiment of the invention.
Figure 3B:
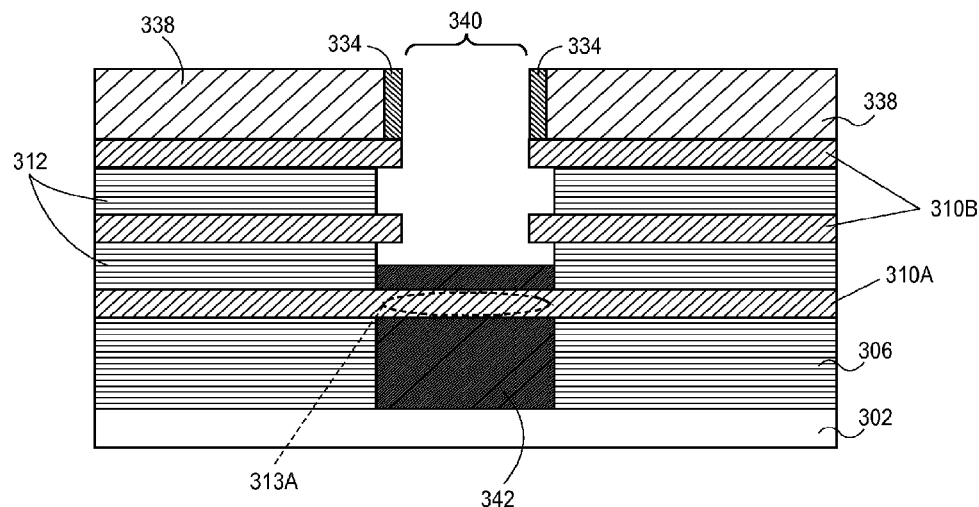
Figure 3C:
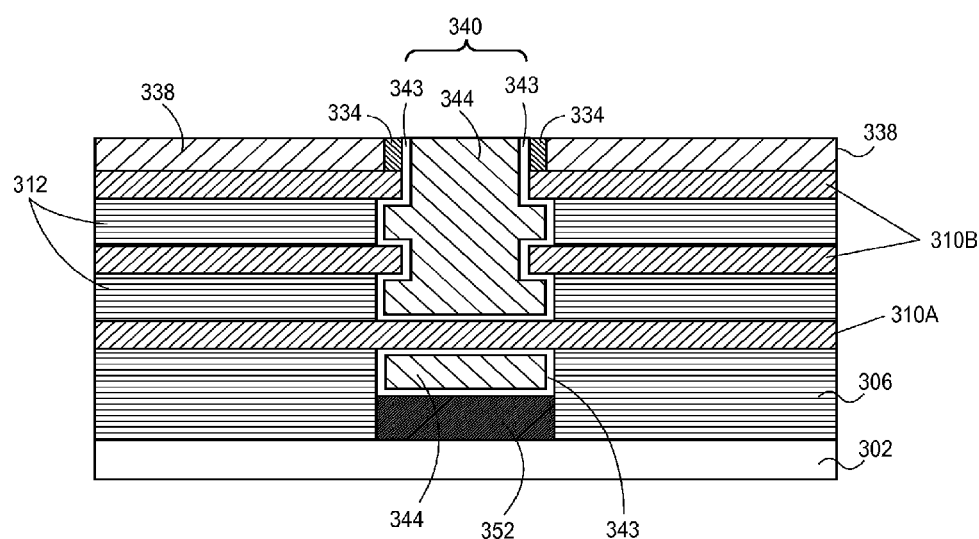

In another embodiment of the invention, more than one nanowire is inactivated by etching the respective channel portions, as shown in FIGS. 3A-3C. In an embodiment, a structure, formed as described above and shown with respect to FIGS. 2A-2G, is provided. In an embodiment, dielectric layer 342 is removed from the top surface of ILD layer 338 and recessed within channel region 340 to expose channel portions 313B of each upper nanowire 310B. The full perimeter of the channel portions 313B are exposed. The channel portion 313A of lower nanowire 310A remains buried in dielectric layer 342. The channel portions 313B of each upper nanowire 312B are then etched sufficiently so that upper nanowires 312B cannot conduct current between source and drain regions 345. In an embodiment, the channel portions 313B are fully etched, as shown in FIG. 3B. The channel portion 313B of each upper nanowire 310B may be etched by the process described above with respect to the etching of the channel portion 213B of upper nanowire 210B in FIG. 2J.

The dielectric material 342 is then further recessed within the channel region to expose channel portion 313A of lower nanowire 310A, as shown in the embodiment illustrated in FIG. 3C. In an embodiment, dielectric material 342 is etched to a depth sufficient to allow the formation of gate dielectric and gate electrode layers all-around the full perimeter of channel portion 313A. In an embodiment, a portion of dielectric material 342 remains on the surface of substrate 302 below lower nanowire 310A to form bottom gate isolation region 352.

A gate dielectric 343 and a gate electrode 344 are then formed within the channel region 340, according to an embodiment of the invention. Gate dielectric 343 and gate electrode 344 are formed as described above with respect gate dielectric 243 and gate electrode 244, as shown in FIG. 2K. Gate dielectric 343 and gate electrode 344 wrap all around the channel portion 313A of lower nanowire 310A, such that the perimeter of lower nanowire 310A determines the gate width for the illustrated embodiment of the transistor.

In another embodiment, wherein two nanowires are inactivated, such as shown in FIGS. 3A-3C, dielectric material 342 is removed from the top surface of ILD layer 338 and recessed within the trench to expose the channel portion 313B of only the upper-most nanowire 310B. The single exposed channel portion 313B is then etched, such as, for example, by the process described above with respect to upper nanowire 210B. Next, in an embodiment, the dielectric material 342 is further recessed to expose the channel portion 313B of the second upper nanowire 310B. The single exposed channel portion 313B is then etched, such as, for example, by the process described above with respect to upper nanowire 210B to form the structure shown in FIG. 3B. In an embodiment, dielectric material 342 is then removed from the surface of the channel portion 313A of lower nanowire 310A so that a functional gate structure may be formed, wrapping around the intact channel portion 313A, as discussed above with respect to lower nanowires 210A and shown in FIG. 3C. Thus, a transistor having two inactive upper nanowires 310B and one active lower nanowire 310A may be formed.

As shown above in FIGS. 2A-2K and 3A-3C, the gate width of a transistor having the same number of nanowires may be varied. In other embodiments of the invention, the nanowire stack may contain more or fewer nanowires. Generally, at least one nanowire is active, but the disclosed process may be used to form sacrificial transistors having zero active nanowires.

In another aspect of the invention, the gate width of a nanowire-based transistor is varied by isolating the channel portion one or more nanowires from a source/drain region of the device. FIGS. 4A-E illustrate two dimensional cross-sectional views representing various operations in a method of fabricating a nanowire-based transistor, in accordance with an embodiment of the present invention.

Figure 4A:
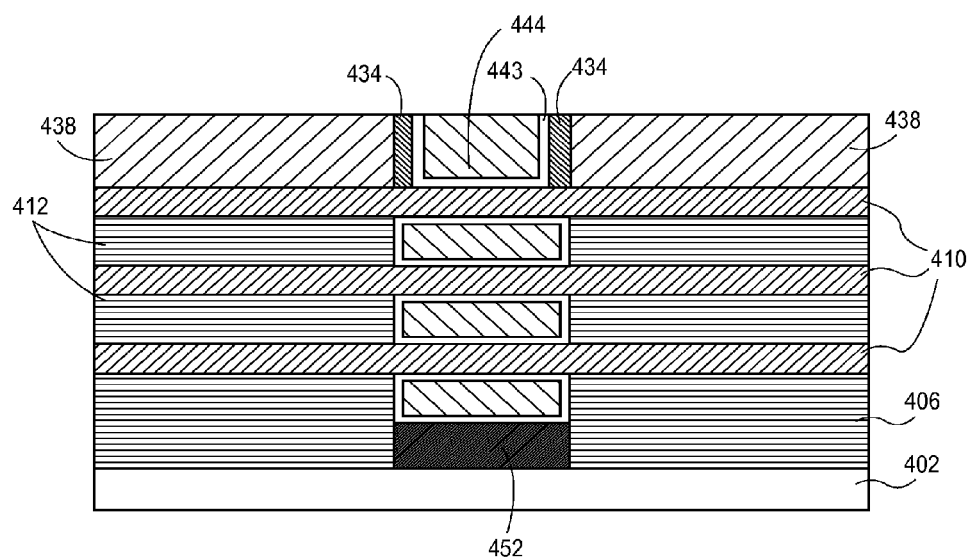
FIGS. 4A-4E illustrate a two-dimensional cross-sectional view of operations in a process for forming a nanowire-based transistor, in accordance with an embodiment of the invention.

A structure comprising a plurality of nanowires 410 disposed in a vertical stack over a substrate 402 is provided, as shown in FIG. 4A. A gate structure comprising gate dielectric 443 and gate electrode 444 wraps around the channel region of each nanowire 410. In an embodiment, gate dielectric 443 is a sacrificial gate dielectric, and gate electrode 444 is a sacrificial gate electrode. Bottom gate isolation region 452 isolates the gate structure from substrate 402. The source and drain portions 411 of each nanowire 410 are supported by fin base fin 406 and sacrificial material 412. ILD layer 438 covers the top nanowire in the source and drain regions 445. The structure may be formed as described above with respect to FIGS. 2A-2K, omitting the operations whereby the channel portion of a nanowire is severed.

Figure 4B:
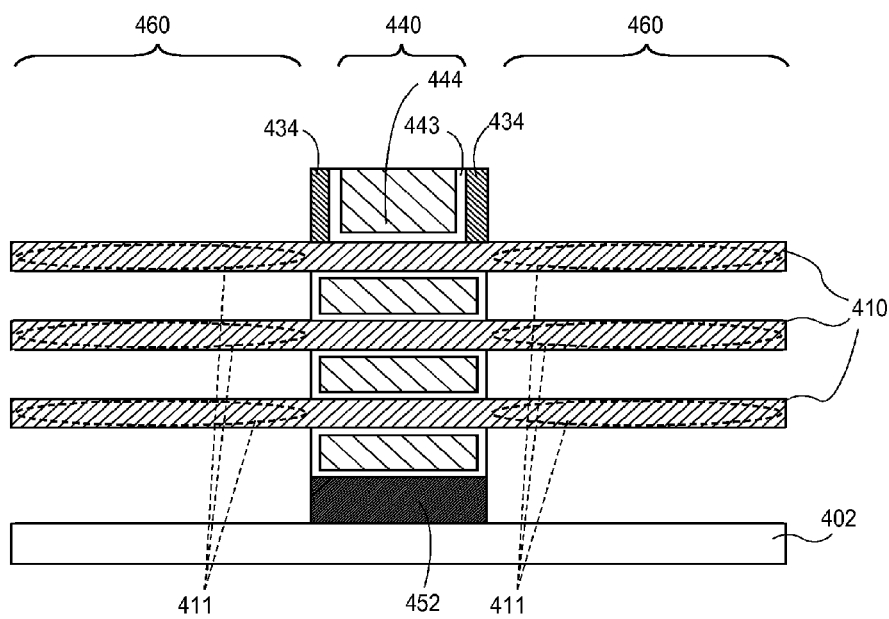

To form source and drain contacts, openings 460 are etched from the surface of ILD layer 438 to the surface of substrate 402, removing portions of ILD layer 438, sacrificial material 412 and base fin 406 to expose the full perimeter of the source and drain portions 411 of each nanowire 410, as shown in FIG. 4B. ILD layer 438, sacrificial material 412, and fin 406 are removed by an etch process that is selective to the nanowire 410 material. In an embodiment, openings 460 are etched using a photolithography process.

After removal of the sacrificial material 412, nanowires 410 are supported by the gate structure, as shown in FIG. 4B. In an embodiment, nanowires 410 are additionally supported by a sacrificial gate structure adjacent to the source/drain portion 411. In another embodiment, nanowires 410 are further supported by a functional gate structure associated with adjacent devices. In another embodiment, nanowires 410 may terminate at the end of the source/drain portion 411.

Figure 4C:
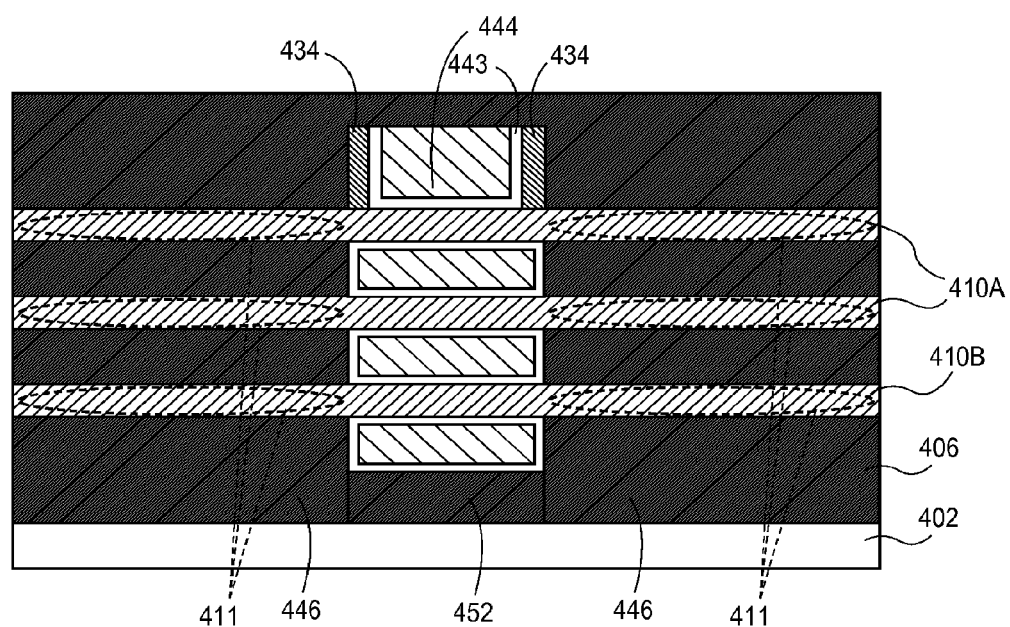
Figure 4D:
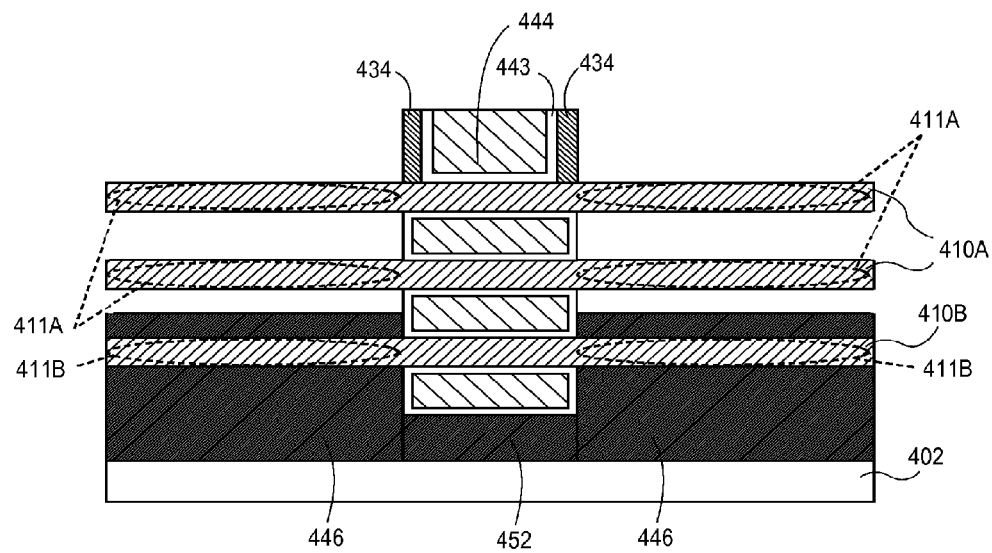

Next, dielectric material 446 is blanket deposited over the substrate, completely filling openings 460, as shown in FIG. 4C. Dielectric material 446 is then etched from the surface of ILD layer 438 and recessed within opening 460 to expose a number of source and drain portions 411 corresponding to the desired number of active nanowires, as shown in FIG. 4D. In an embodiment, the perimeter of the source and drain portions 411A of each upper nanowire 410A are completely exposed. In an embodiment, dielectric material 446 completely covers the source and drain portions 411B of lower nanowire 410B at the bottom of opening 460.

Figure 4E:
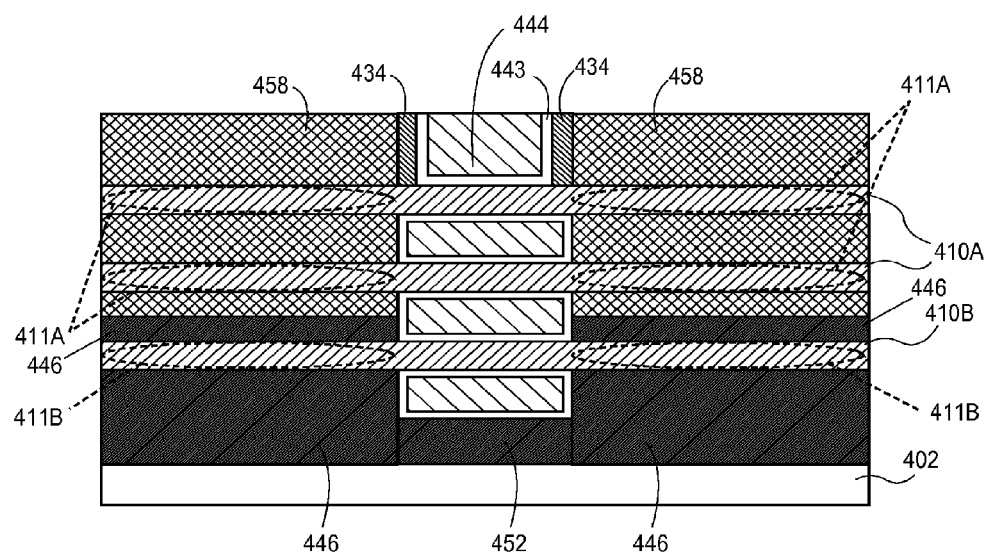

In an embodiment, source and drain contacts 458 are formed in openings 460, as shown in FIG. 4E. In an embodiment, source and drain contacts 458 wrap all around the source and drain portions 411A of each active nanowire 410A. Source and drain contacts 458 may be formed by any method suitable to ensure conformal contact all-around the source and drain portions 411A of each upper nanowire 410A. In an embodiment, source and drain contacts 458 are deposited by CVD. In an embodiment, source and drain contacts 458 are formed from a metal species as discussed above with respect to source and drain contacts 158, shown in FIG. 1B. In another embodiment, prior to forming contacts, the source and drain portions 411A are removed from within openings 460. In an embodiment, metal is deposited within opening 460 to form contact with channel portions 411A. Dielectric material 446 at the bottom of opening 460 prevents source and drain contacts 458 from coming into electrical contact with the source and drain portions 411B of inactive nanowire 410B.

In an embodiment where gate dielectric 443 is a sacrificial gate dielectric, and gate electrode 444 is a sacrificial gate electrode, a functional gate is formed by a replacement gate process after the formation of contacts 458.

Thus, a transistor comprising two active nanowires 410A and one inactive nanowire 410B is formed. The gate width of the transistor is equal to the combined lengths of the perimeters of the channel portions 411A of active nanowires 410A. While FIGS. 4A-4E illustrate isolation of the channel portion from both the source region and the drain region, it is to be understood that isolation from only the source region or the drain region is sufficient to inactivate a nanowire.

Figure 5A:
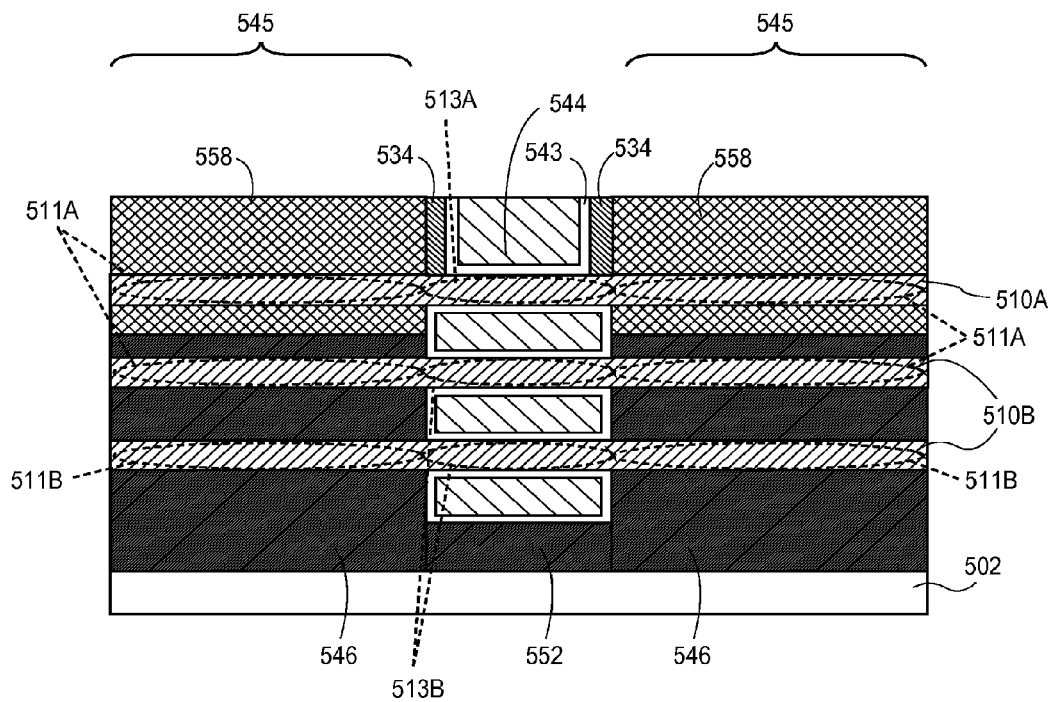
FIGS. 5A-5C illustrate a two-dimensional cross-sectional view of embodiments of a nanowire-based semiconductor structure.

The number of active and inactive nanowires in a nanowire stack may be varied to achieve transistors having different gate widths. In the embodiment illustrated by FIG. 5A, a transistor comprises a vertical stack of nanowires 510 disposed above substrate 502. A gate structure comprising gate dielectric layer 543 and gate electrode 544 wraps around the channel portions 513 of nanowires 510. The gate structure has sidewall spacers 534, shown above the top nanowire. The nanowire stack has one active nanowire 510A and two inactive nanowires 510B, where the source and drain portions 511B of each inactive nanowire 510B are buried in dielectric material 546 so that channel portions 513B are electrically isolated from source and drain regions 545. Source/drain contacts 558 are formed to wrap around the source and drain portions 511A of active nanowires 510A. The perimeter of the channel portion 513A of active nanowire 510A determines the gate width of the transistor.

Figure 5B:
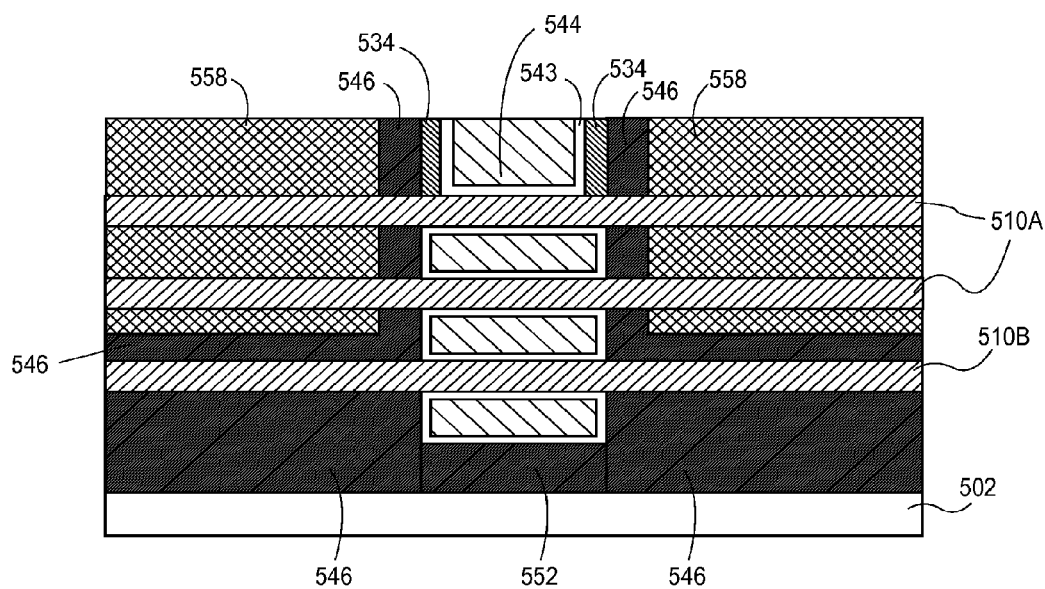

In another embodiment, dielectric material 546 is etched such that a portion remains adjacent to the gate structure, as shown in FIG. 5B. The dielectric material reduces Miller capacitance between the gate and the source and drain contacts. In an embodiment, after blanket depositing dielectric material 546 over the structure, as discussed above with respect to FIG. 4C, the dielectric material is polished to be planar with the top surface of the gate structure. Then, a mask is formed over the dielectric material adjacent to the gate structure. Contact trenches are then etched to expose source and drain portions of active nanowires 510A, while a portion of the dielectric material 546 is preserved in the source/drain region adjacent to the gate structure. In an embodiment, the trench etch exposes part of source and drain portions, while another part of source/drain portions extends between the dielectric material 546 adjacent to the gate structure. Contacts may then be formed in the trenches, above the dielectric material 546 covering the source and drain portions of inactive nanowires 510B. The width of the dielectric material adjacent to the gate structure may vary along the depth of the trench, from 0 to 500 Å wide.

Figure 5C:
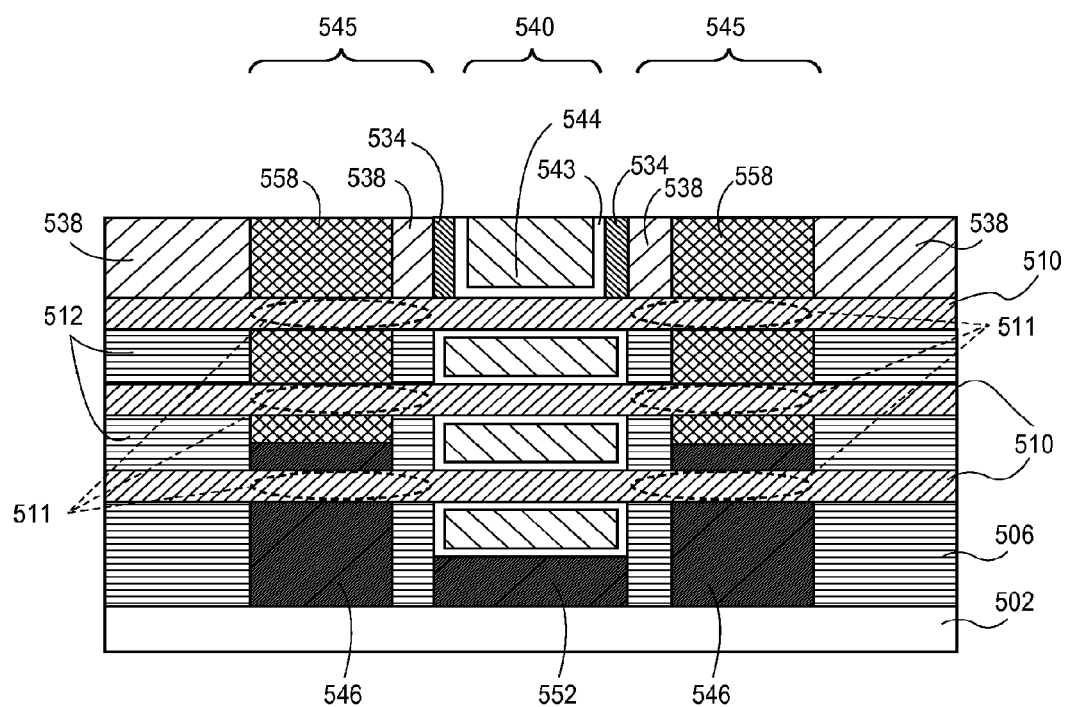

In another embodiment, portions of ILD layer 538, sacrificial material 512, and base fin 506 are preserved adjacent to the gate structure, as shown in FIG. 5C. Portions of ILD layer 538, sacrificial material 512, and base fin 506 may be preserved by masking a portion of ILD layer 538 during the etching of the contact trench. In this embodiment, sacrificial material 512 is insulative or semi-insulative, so that no or substantially no leakage path is created by the sacrificial material 512, and so that the channel portion of the inactive nanowire remains electrically isolated from the source and drain regions of the device.

Figure 6:
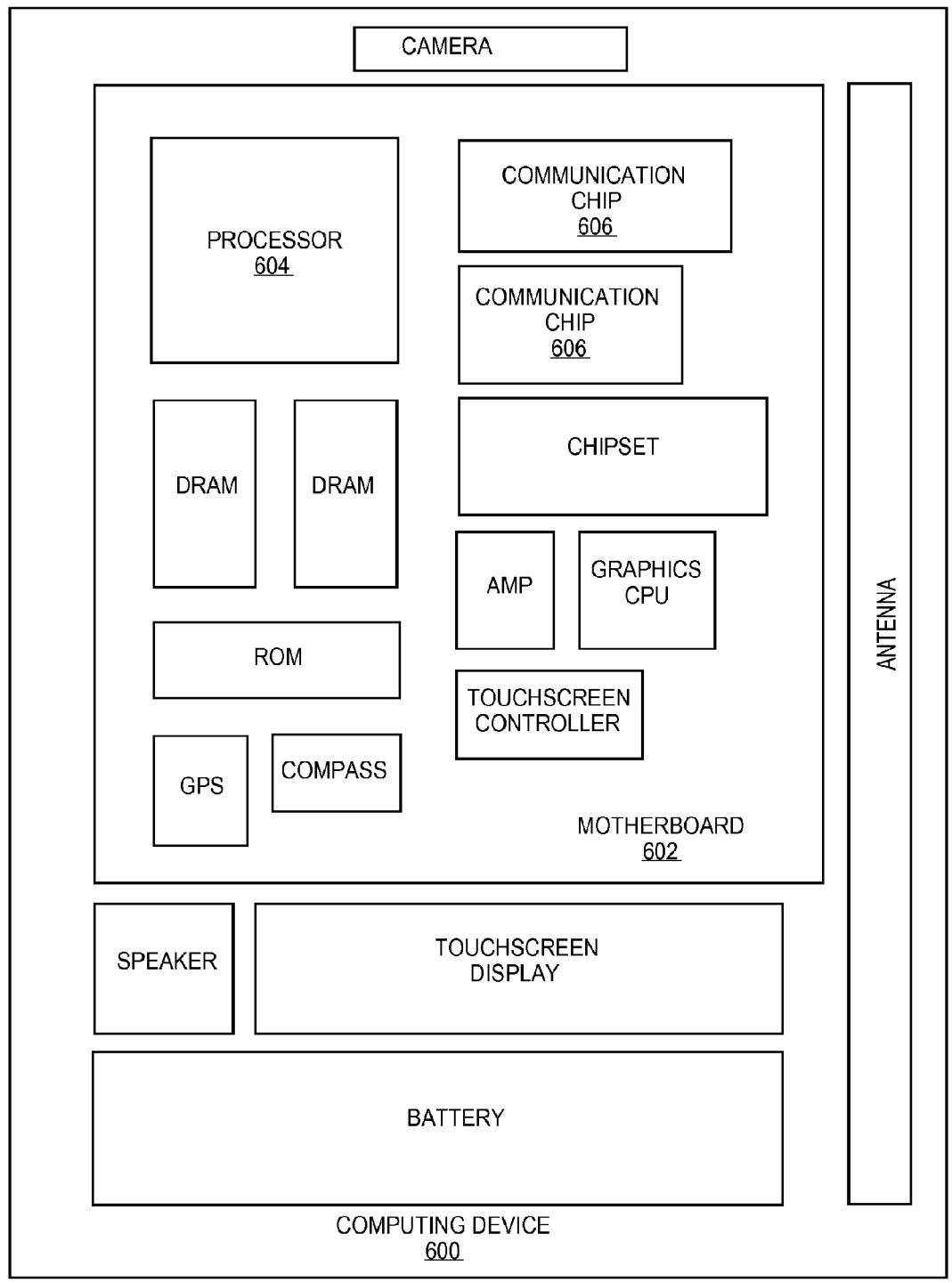
FIG. 6 illustrates a computing device in accordance with one embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more gate all-around transistors having a vertical stack of nanowires with at least one inactive nanowire, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more gate all-around transistors having a vertical stack of nanowires with at least one inactive nanowire, in accordance with implementations of the invention.

In further implementations, another component housed within the computing device 600 may contain an integrated circuit die that includes one or more gate all-around transistors having a vertical stack of nanowires with at least one inactive nanowire, in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

What is claimed is:
1. A semiconductor device, comprising:
a plurality of vertically stacked nanowires disposed above a substrate, each of the plurality of vertically stacked nanowires formed of a same semiconductor material wherein one of the nanowires of the plurality of vertically stacked nanowires is an active nanowire and wherein one of the nanowires of the plurality of vertically stacked nanowires is an inactive nanowire, wherein the same semiconductor material of the inactive nanowire is severed in the channel region of the inactive nanowire;
a gate structure wrapped around the active nanowire, defining a channel region of the device; and
a source region and a drain region on opposite sides of the channel region.

2. The device of claim 1,
wherein the source region and the drain region are formed from a homogeneous material.

3. The device of claim 2, wherein the homogeneous material is a single-crystalline semiconductor.

4. The device of claim 2, wherein the homogeneous material is a metal.

5. The device of claim 1, wherein the source region and the drain region are formed from a heterogeneous stack of semiconductor films.

6. The device of claim 1,
wherein the active nanowire has an active source portion within the source region of the device and
an active drain portion within the drain region of the device, and
wherein a metal source contact is wrapped around the active source portion and
a metal drain contact is wrapped around the active drain portion.

7. The device of claim 1, wherein the same semiconductor material of the active nanowire and the inactive nanowire is silicon.

8. The device of claim 1, wherein the same semiconductor material of the active nanowire and the inactive nanowire is germanium.

9. A semiconductor device, comprising:
a plurality of vertically stacked nanowires disposed above a substrate, each of the plurality of vertically stacked nanowires formed of a same semiconductor material wherein one of the nanowires of the plurality of vertically stacked nanowires is an active nanowire and wherein one of the nanowires of the plurality of vertically stacked nanowires is an inactive nanowire;
a gate structure wrapped around the active nanowire, defining a channel region of the device; and
a source region and a drain region on opposite sides of the channel region wherein the same semiconductor material of the inactive nanowire is severed in the channel region of the inactive nanowire.

10. The device of claim 9, wherein the source region and the drain region are formed from a homogeneous material.

11. The device of claim 10, wherein the homogeneous material is a single-crystalline semiconductor.

12. The device of claim 10, wherein the homogeneous material is a metal.

13. The device of claim 9, wherein the source region and the drain region are formed from a heterogeneous stack of semiconductor films.

14. The device of claim 9, wherein the active nanowire has an active source portion within the source region of the device and an active drain portion within the drain region of the device, and wherein a metal source contact is wrapped around the active source portion and a metal drain contact is wrapped around the active drain portion.

15. The device of claim 9, wherein the same semiconductor material of the active nanowire and the inactive nanowire is silicon.

16. The device of claim 9, wherein the same semiconductor material of the active nanowire and the inactive nanowire is germanium.

* * * * *